United States Patent
Nakajima et al.

(10) Patent No.: US 10,734,463 B2
(45) Date of Patent: Aug. 4, 2020

(54) COLOR-INSENSITIVE WINDOW COATINGS FOR AMBIENT LIGHT SENSORS

(71) Applicant: Apple Inc., Cupertino, CA (US)

(72) Inventors: Kenichi Nakajima, Kanagawa Ken (JP); James R. Wilson, Cupertino, CA (US); Zhang Jia, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 221 days.

(21) Appl. No.: 15/071,119

(22) Filed: Mar. 15, 2016

(65) Prior Publication Data

US 2017/0271427 A1 Sep. 21, 2017

(51) Int. Cl.
*H01L 27/32* (2006.01)
*H01L 51/52* (2006.01)
*G09G 3/20* (2006.01)
*G02F 1/133* (2006.01)

(52) U.S. Cl.
CPC ........ *H01L 27/3269* (2013.01); *H01L 27/322* (2013.01); *H01L 51/5284* (2013.01); *G02F 1/13318* (2013.01); *G09G 3/2003* (2013.01); *G09G 2320/0242* (2013.01); *G09G 2360/144* (2013.01)

(58) Field of Classification Search
CPC .............. H01L 27/322; H01L 51/5284; G09G 2320/0242; G09G 2320/144; G09G 3/2003; G02F 1/13318
USPC ........................................................ 257/82
See application file for complete search history.

(56) References Cited

U.S. PATENT DOCUMENTS

| | | | |
|---|---|---|---|
| 5,882,774 A | 3/1999 | Jonza et al. | |
| 8,329,247 B2 | 12/2012 | Banerjee et al. | |
| 2006/0049533 A1* | 3/2006 | Kamoshita | H01L 24/97 264/1.7 |
| 2009/0069513 A1* | 3/2009 | Nakanishi | C08G 59/04 525/523 |
| 2013/0176512 A1* | 7/2013 | Posner | G02F 1/1333 349/33 |
| 2013/0341624 A1* | 12/2013 | Cho | H01L 29/66742 257/57 |

(Continued)

FOREIGN PATENT DOCUMENTS

JP 2008231167 10/2008

*Primary Examiner* — Vongsavanh Sengdara
(74) *Attorney, Agent, or Firm* — Treyz Law Group, P.C.; G. Victor Treyz; David K. Cole

(57) ABSTRACT

An electronic device may have a display with a transparent layer such as a cover layer. An ambient light sensor may be aligned with an ambient light sensor window formed from an opening in a masking layer on the transparent layer in an inactive portion of the display. To help mask the ambient light sensor window from view, the ambient light sensor window may be provided with a black coating that matches the appearance of surrounding masking layer material while allowing light to reach the ambient light sensor. The black coating may include multiple pigments and may have a flat spectrum to enhance color ambient light measurements made with the ambient light sensor. The black coating may include a polymer binder or other binder that contains multiple pigments. The pigments may include a black pigment, a blue pigment, and an infrared-light-transparent pigment and/or other pigments.

21 Claims, 7 Drawing Sheets

(56) References Cited

U.S. PATENT DOCUMENTS

| | | | |
|---|---|---|---|
| 2014/0049700 A1* | 2/2014 | Chen | G02B 5/201 349/12 |
| 2014/0152943 A1 | 6/2014 | Dorjgotov et al. | |
| 2014/0231625 A1* | 8/2014 | Chang | G06F 1/1684 250/208.1 |
| 2016/0054175 A1 | 2/2016 | Jia et al. | |

* cited by examiner

COLOR-INSENSITIVE WINDOW COATINGS FOR AMBIENT LIGHT SENSORS

FIELD

This relates generally to electronic devices and, more particularly, to electronic device window coatings.

BACKGROUND

Electronic devices often contain displays. A display may have an active area with pixels that display images for a user and an inactive area alongside the active area. A layer of glass may serve as a protective display cover layer. The layer of glass may overlap the active area and the inactive area. To hide internal components from view, the inner surface of the inactive area may be covered with an opaque masking layer such as a layer of black ink. Windows in the display cover layer may be formed from openings in the opaque masking layer. Light-sensitive components may be aligned with the windows. For example, an ambient light sensor may be aligned with a window in a display.

To improve the outward appearance of the display cover layer in the inactive area, ambient light sensor windows may be covered with coatings of dark ink. Dark ink coatings for ambient light sensor windows are sometimes referred to as ambient light sensor inks. The presence of the ambient light sensor ink on an ambient light sensor will darken the outward appearance of the ambient light sensor window and thereby help visually blend the ambient light sensor window with surrounding portions of the layer of black ink in the inactive area. At the same time, the ambient light sensor ink will be sufficiently transparent to allow ambient light to reach the ambient light sensor that is aligned with the ambient light sensor window.

Although the presence of ambient light sensor ink on an ambient light sensor window may help improve device aesthetics, the presence of the ambient light sensor ink may introduce non-ideal characteristics to an ambient light sensor system. For example, ambient light sensor readings may vary as a function of the angle of incidence of incoming ambient light with respect to the ambient light sensor system.

SUMMARY

An electronic device may have a display with a transparent layer such as a cover layer. An ambient light sensor may be aligned with an ambient light sensor window formed from an opening in a masking layer on the transparent layer in an inactive portion of the display. To help mask the ambient light sensor window from view, the ambient light sensor window may be provided with a coating that matches the appearance of surrounding masking layer material while allowing light to reach the ambient light sensor.

The coating may be a black coating that contains a black pigment such as carbon black. The coating may have a flat transmission spectrum to enhance accuracy when making color ambient light measurements with the ambient light sensor. Pigments of different colors may be incorporated into the coating to provide the coating with a flat transmission spectrum. The coating may include a polymer or other coating material that contains multiple pigments of different colors. The pigments may include the black pigment, a blue pigment, and an infrared-light-transparent pigment and/or pigments of other colors.

DETAILED DESCRIPTION

Figure 1:
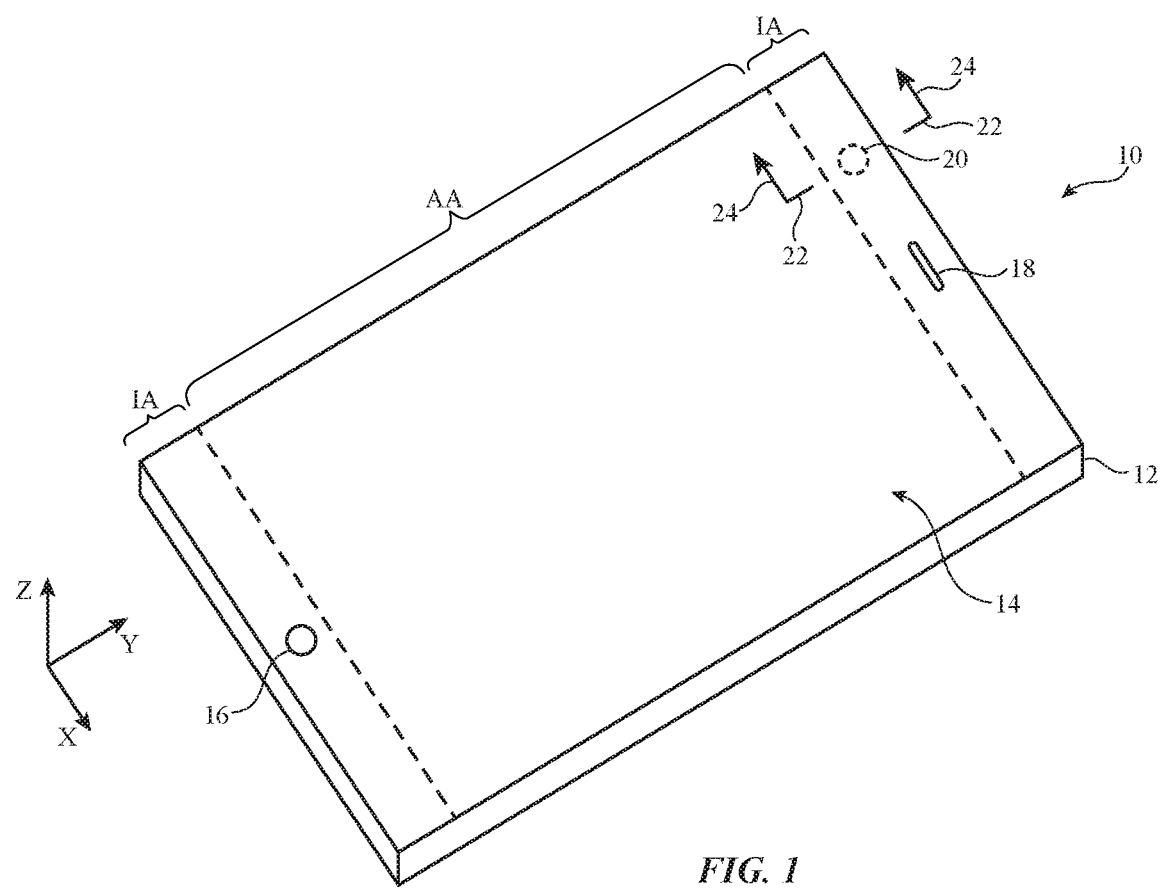
FIG. 1 is a perspective view of an illustrative electronic device in accordance with an embodiment.

Electronic devices may be provided with displays. A display may have an active area containing an array of pixels that is used to display images and an inactive area that is free of pixels. Circuitry and internal device components may be mounted under the inactive area.

A protective display cover layer for the display may be formed from a layer of transparent material. The display cover layer may overlap both the active area and the inactive area of the display. The portion of the display cover layer that overlaps the active area is free of ink and is transparent. An inner surface of the portion of the display cover layer that overlaps the inactive area may be coated with an opaque masking layer to help hide internal structures in the device from view by a user. The opaque masking layer may be formed from a polymer with light absorbing pigment (e.g., carbon black particles, etc.) or other suitable opaque structure. The opaque masking layer may be, for example, a layer of black ink or an opaque layer of another color.

Openings may be formed in the opaque masking layer to form light-transmitting windows. These windows, which may sometimes be referred to as optical windows or light windows, may be used to accommodate light-based components. For example, a camera may capture images through a window in a display cover layer, an ambient light sensor may make measurements of ambient light levels through a window in the display cover layer, and a light-based proximity sensor may be used to make proximity sensor measurements though a window in the display cover layer. In some situations (e.g., when forming windows for components such as cameras that operate at visible light wavelengths), the windows may be transparent at visible wavelengths and may be free of any coating layers. In other situations, such as when forming a window for an ambient light sensor, it may be desirable coat the window so as to at least partly obscure the window. This may be accomplished, for example, by coating an ambient light sensor window with a dark coating that transmits sufficient ambient light to an ambient light sensor to allow the ambient light sensor to make ambient light measurements. The dark appearance of the coating may allow the ambient light sensor window to blend in with the appearance of nearby portions of the black ink or other opaque masking layer in the inactive area.

In general, window coatings for ambient light sensors may have any suitable color (e.g., white, gray, black, or other colors). These coatings may transmit any suitable amount of light (e.g., the transmission of these coatings may be greater than 50%, less than 50%, 5-20%, less than 30%, less than 20%, less than 10% or other suitable value). Coatings may be provided on windows for infrared and visible light cameras, for infrared components, for light sensing arrays associated with user input-output devices (e.g., touch sensors or fingerprint sensors), for proximity sensors, or for any other suitable light-based component in device 10. Configurations in which an ambient light sensor window is provided with a coating may sometimes be described herein as an example. This is, however, merely illustrative. Coatings may be provided on any suitable transparent window structure in device 10.

FIG. 1 is a perspective view of an illustrative electronic device of the type that may include a display with windows for light-based components such as an ambient light sensor. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes display 14. Display 14 has been mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Openings may be formed in housing 12 to form communications ports, holes for buttons, and other structures.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch sensor electrodes may be formed from an array of indium tin oxide pads or other transparent conductive structures.

Display 14 may have an active area AA that includes an array of pixels. The array of pixels may be formed from liquid crystal display (LCD) components, an array of electrophoretic pixels, an array of plasma display pixels, an array of organic light-emitting diode pixels or other light-emitting diode pixels, an array of electrowetting pixels, or pixels based on other display technologies.

Display 14 may be protected using a display cover layer such as a layer of transparent glass, clear plastic, transparent ceramic, sapphire or other transparent crystalline material, or other transparent layer(s). The display cover layer may have a planar shape, a convex curved profile, a concave curved profile, a shape with planar and curved portions, a layout that includes a planar main area surrounded on one or more edges with a portion that is bent out of the plane of the planar main area, or other suitable shape. Openings may be formed in the display cover layer to accommodate button 16, ports such as speaker port 18, and other structures. In some configurations, display 14 may have an outer layer such as a color filter layer or a thin-film transistor layer in a liquid crystal display that is sufficiently thick and strong to serve as a display cover layer. In other configurations, the outermost layer of display 14 may be a separate cover layer that does not have any color filter elements or thin-film transistor circuitry.

Display 14 may have an inactive border region such as inactive area IA that runs along one or more of the edges of active area AA. Inactive area IA may be free of pixels for displaying images and may overlap circuitry and other internal device structures in housing 12. To block these structures from view by a user of device 10, the underside of the display cover layer (i.e., the outermost layer) for display 14 may be coated with an opaque masking layer in inactive area IA. The opaque masking layer may have any suitable color. With one suitable arrangement, which may sometimes be described herein as an example, the opaque masking layer in regions IA of display 14 may be formed from a layer of black ink (e.g., polymer with carbon black or other black pigment) that is opaque at visible wavelengths.

Openings may be formed in the black ink coating on the underside of the display cover layer in inactive area IA. These openings may form windows for light-based components in device 10. In the example of FIG. 1, window 20 has been formed in inactive area IA along an upper edge of display 14. In general, windows such as window 20 may be formed in any suitable portion of display 14 (i.e., in other portions of inactive area IA) or other transparent structures in device 10. The configuration of FIG. 1 is merely illustrative.

Window 20 may be circular, rectangular, or may have other suitable shapes. Window 20 may be aligned with a light-based component such as an ambient light sensor and may have an ambient light sensor coating. The ambient light sensor coating is sufficiently transparent to allow ambient light to reach the ambient light sensor while being sufficiently close in appearance to surrounding portions of the opaque black masking layer in inactive area IA to help obscure window 20 from view by a user of device 10.

The ambient light sensor under window 20 may be a color ambient light sensor. Color ambient light sensors measure light intensities at multiple wavelengths and can therefore make color and intensity measurements on ambient light. Ambient light may be characterized by light rays of different angles of incidence. These light rays may travel along paths of different lengths through the ambient light sensor coating. To reduce angle-of-incidence dependence in color measurements due to these path length differences and thereby enhance color measurement accuracy, the light transmission spectrum of the ambient light sensor coating window preferably does not vary significantly as a function of wavelength.

Figure 2:
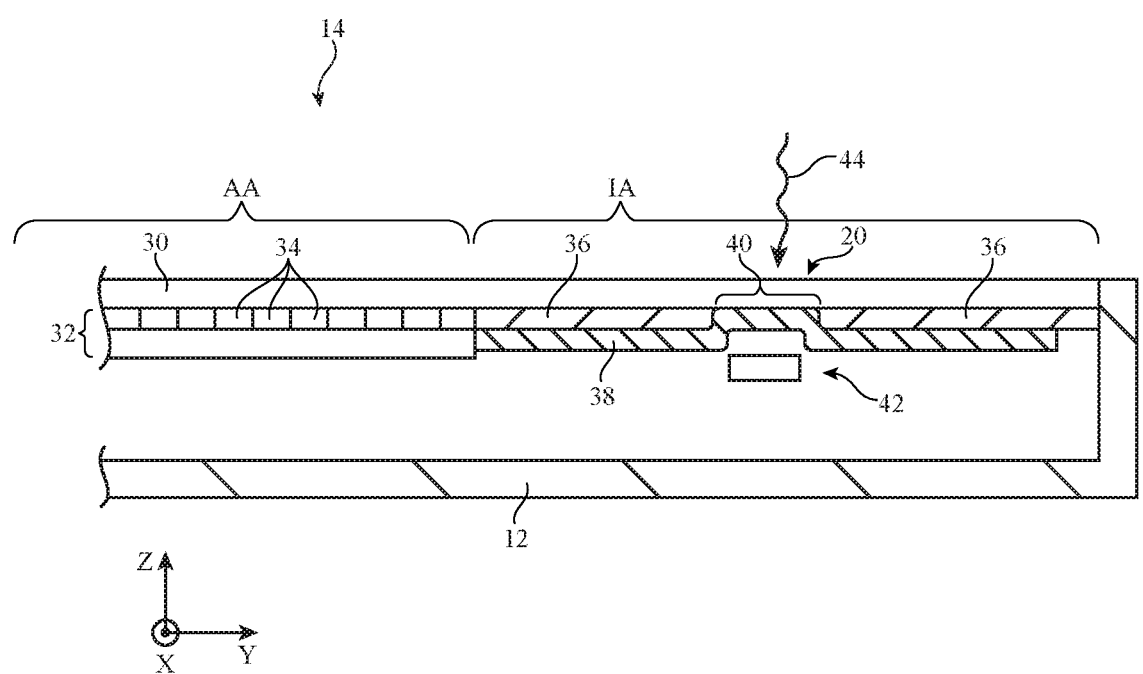
FIG. 2 is a cross-sectional side view of a portion of an illustrative electronic device with a window and an aligned light-based component such as an ambient light sensor in accordance with an embodiment.

FIG. 2 is a cross-sectional side view of a portion of device 10 of FIG. 1 in the vicinity of window 20 taken along line 22 of FIG. 1 and viewed in direction 24. As shown in FIG. 2, display 14 may have a transparent layer such as display cover layer 30 (i.e., the outermost layer of display 14). Display cover layer 30 may be formed from a transparent material such as glass, plastic, sapphire or other crystalline material, transparent ceramic, etc. In active area AA, display 14 may contain structures 32 (e.g., an organic light-emitting diode display layer, a liquid crystal display module, etc.) with an array of pixels 34 for displaying images.

The inner surface of display cover layer 30 may be coated with one or more layers of material in inactive area IA. In the example of FIG. 2, the underside of display cover layer 30 in inactive area IA has been coated with opaque masking layer 36. Opaque masking layer 36 may be, for example, a layer of black ink. Opening 40 for window 20 may be formed in opaque masking layer 36. Ambient light sensor coating layer 38 may overlap opening 40 and may provide window 20 with a desired appearance. For example, coating layer 38 (which may sometimes be referred to as a window coating layer) may include black pigment such as carbon black pigment and pigments of other colors for adjusting the reflection characteristics of layer 38 (e.g., so that the darkness of window 20 matches the darkness of surrounding portions of layer 36). Layer 38 may, if desired, include multiple light-absorbing additives (i.e., multiple pigments), so that layer 38 exhibits a desired light transmission spectrum (e.g., a flat spectrum that helps improve color measurement accuracy for color ambient light sensor measurements made on light passing through layer 38).

As shown in FIG. 2, a light-based component such as component 42 may be aligned with window 20. Component 42 may be a color sensing ambient light sensor that measures ambient light 44. A color sensing ambient light sensor may have an array of detectors each of which measures the amount of light in a different respective color channel (e.g., blue, red, green, channels of other colors, channels that respond to combinations of two different colors, etc.). This allows the color sensing ambient light sensor to determine the color (color coordinates, color temperature, etc.) and intensity of ambient light in the environment surrounding device 10. The color sensing ambient light sensor may, for example, detect cold ambient lighting conditions when a user is in an outdoors shaded environment and warm ambient lighting conditions when a user is in an indoors tungsten lighting environment (as examples).

Color information from the color ambient light sensor may be used to make color corrections to the colors displayed by pixels 32 in display 14 or to make other adjustments to the performance of device 10. If desired, one or more of the color channels in sensor 42 may be responsive to infrared light. Monochromatic ambient light sensors may also be used in device 10 (i.e., sensor 42 may be a monochromatic ambient light sensor).

Figure 3:
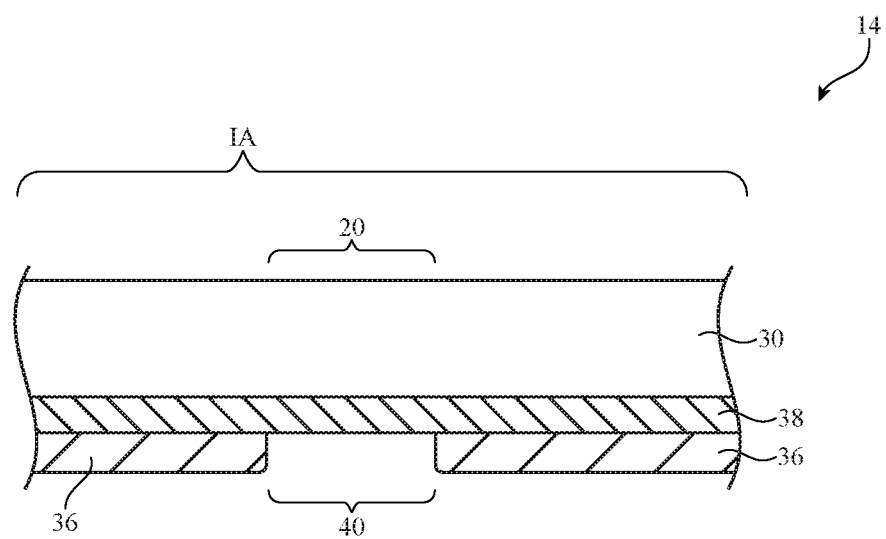
FIG. 3 is a cross-sectional side view of a portion of a display with a coated window in accordance with an embodiment.

In the example of FIG. 2, window coating 38 has been deposited over the inner surface of opaque masking layer 36 after opening 40 has been formed in layer 36. Layer 36 may be deposited and patterned using screen printing or other suitable techniques. If desired, coating 38 may be deposited on the inner surface of display cover layer 30 before depositing layer 36 and patterning layer 36 to form opening 40 for window 20 (see, e.g., FIG. 3). In configurations in which coating 38 has a sufficiently opaque appearance, some or all of opaque masking layer 36 may be omitted from inactive area IA. Configurations in which coating 38 is formed primarily within opening 40 may also be used.

Figure 4:
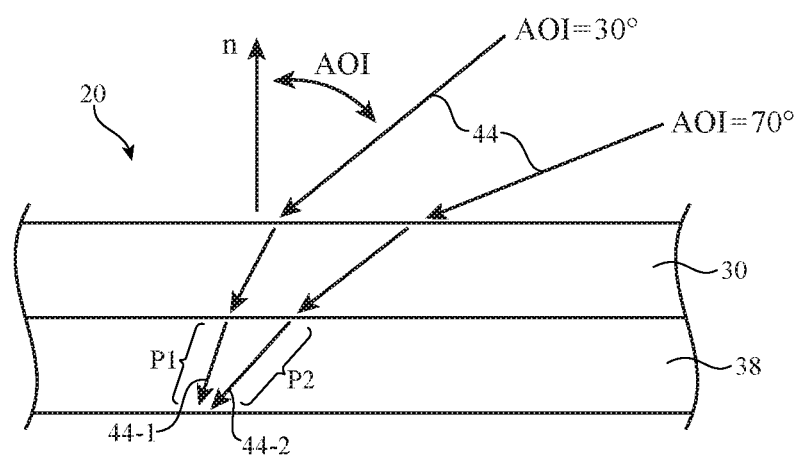
FIG. 4 is a cross-sectional side view of an illustrative coating layer showing how incoming light rays may be characterized by different angles-of-incidence with respect to a surface normal for the coating layer in accordance with an embodiment.

As shown in FIG. 4, incoming ambient light such as ambient light 44 of FIG. 2 may be characterized by a range of angles of incidence AOI with respect to surface normal n of display cover layer 30 in window 20 (i.e., the surface normal of the portion of display 14 in window 20). Light 44 refracts when passing through the layers of material in window 20. In the configuration of FIG. 4, for example, light 44 is refracted when passing from air in the vicinity of device 10 to layer 30 and may refract again when passing from layer 30 into ambient light sensor coating layer 38 (if the index of layer 38 does not match that of layer 30).

Due to the differences in the angle of incidence of different light rays 44, not all of light rays 44 will pass through the same amount of material in layer 38. In the FIG. 4 example, light ray portion 44-1 (the portion of the light ray of FIG. 4 that has an angle-of-incidence of 30°) is characterized by a path length P1 through layer 38, whereas light ray portion 44-2 (the portion of the light ray of FIG. 4 that has an angle-of-incidence of 70°) is characterized by a path length P2 through layer 38. Path lengths P2 and P1 are different due to the different angles of incidence of the light rays.

The transmission spectrum of layer 38 is preferably relatively flat (invariant with wavelength). As a result, incoming light with a high angle of incidence (i.e., light that passes through a relatively long length P2 of layer 38) will have the same spectrum when exiting layer 38 as light with a low angle of incidence (i.e., light that passes through a relatively short length P1 of layer 38). If desired, the index of refraction of layer 38 may also be made relatively large (e.g., more than 1.6 more than 1.8, more than 2.0, etc.) to help refract light ray portions 44-1 and 44-2 more towards the axis of surface normal n and, by virtue of aligning these light rays so that they travel more perpendicularly with respect to the surfaces of layer 38, reduce path length difference P2-P1. This will also reduce the influence of the shape of the transmission spectrum of layer 38 on the shape of the spectrum of light reaching light sensor 42.

Layer 38 may be provided with a flat transmission spectrum by incorporating additives into a binder material that each have different spectral responses. The binder material for layer 38 may be an organic material such as polymer (e.g., an acrylic resin or other polymer resin that is cured using light curing, thermal curing, catalytic curing, etc.) or other suitable binder. The additives that are incorporated into layer 38 may include pigments such as black pigment (e.g., carbon black), blue pigment, infrared-light transmitting pigment, pigments of other colors, or other materials that have non-flat light transmission spectrums. Any suitable number of pigments or other additives may be incorporated into the polymer of layer 38 (e.g., two or more, three or more, four or more, five or more, etc.) to help shape the transmission spectrum of layer 38 (i.e., to flatten the transmission spectrum). Illustrative configurations in which three different pigments (i.e., three pigments of different colors) are added to layer 38 may sometimes be described herein as an example. This is, however, merely illustrative. If desired, pigments or other additives may be used to help match the appearance of layer 38 to adjacent portions of layer 36 (e.g., to match the reflectance, color, etc., of layers 36 and 38).

Figure 5:
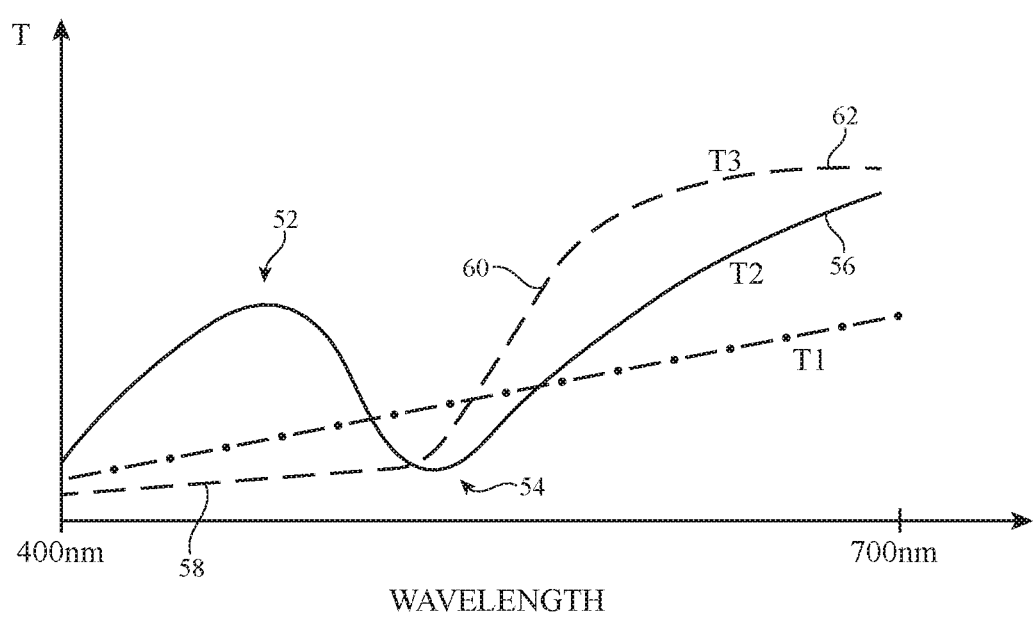
FIG. 5 is a graph of light transmission spectra for pigments in an illustrative ambient light sensor coating layer in accordance with an embodiment.
Figure 6:
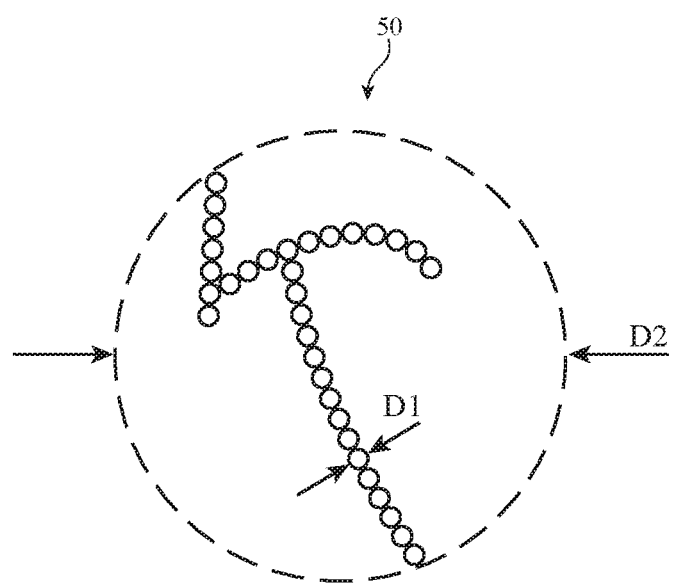
FIG. 6 is a diagram of illustrative black pigment such as carbon black in accordance with an embodiment.

Consider, as an example, the scenario of FIG. 5. FIG. 5 is a graph containing the transmission spectrums (light transmission T versus wavelength) of three different pigments for layer 38. The pigments of FIG. 5 have different light transmission spectrums (different colors), so adjustment of the relative concentrations of these pigments in layer 38 will influence the overall transmission spectrum of layer 38.

Figure 7:
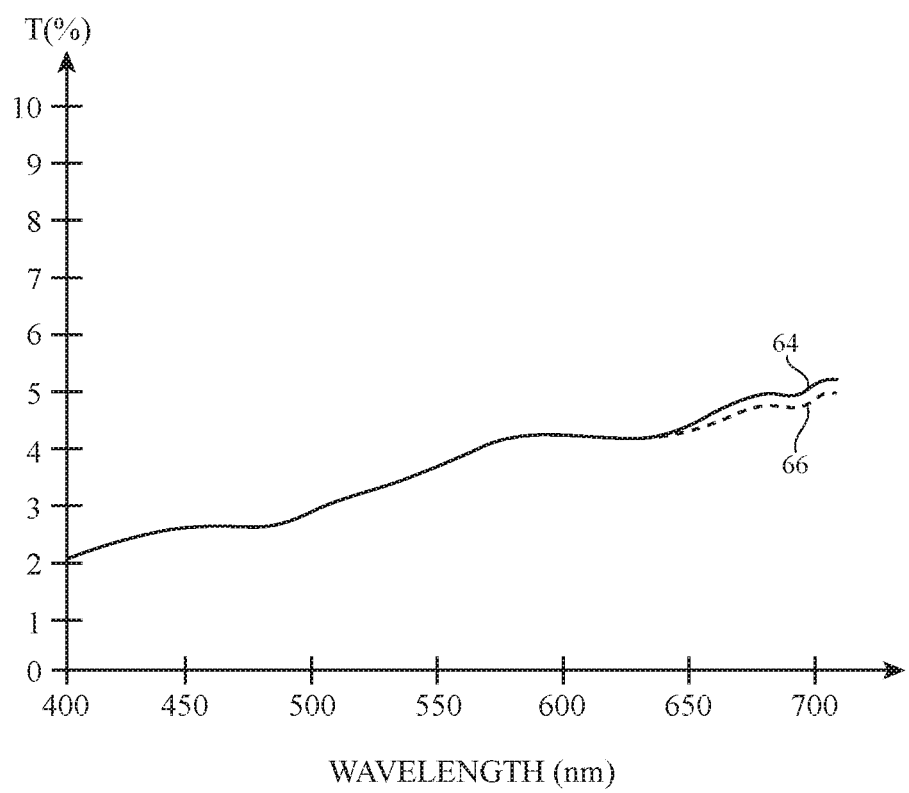
FIG. 7 is a graph in which light transmission for an illustrative ambient light sensor coating has been plotted as a function of wavelength at two different angles of incidence in accordance with an embodiment.

Spectrum T1 is associated with carbon black pigment. Carbon black has a black appearance and may help match the color of layer 38 to the color of layer 36. Carbon black may include aggregates of nanoparticles. With one suitable arrangement, layer 38 includes carbon black pigment that is characterized by relatively small aggregates and nanoparticles of the type shown in FIG. 7. As shown in FIG. 7, carbon black pigment 50 may have a particle size (nanoparticle size) of D1 (e.g., a particle diameter of 20 nm, 15-25 microns, less than 20 nm, less than 30 nm, 10-30 nm, less than 40 nm, less than 25 nm, less than 15 nm, 5-35 nm, more than 5 nm, or other suitable size) and may have an aggregate size of D2 (e.g., an aggregate particle diameter of 10 microns, 5-15 microns, less than 20 microns, 3-25 microns, less than 30 microns, less than 15 microns, less than 10 microns, less than 5 microns, more than 1 micron, or other suitable aggregate size). Pigment with relatively small values of D1 and D2 may be characterized by enhanced dispersion of the pigment and closer packing at the surface of layer 38, which may help minimize light scatter and reflection while enhancing uniformity.

Spectrum T2 of FIG. 5 is associated with a blue pigment and has a light transmission peak at blue wavelengths (e.g., peak 52), a high transmission 56 at red wavelengths, and a transmission valley at intermediate visible wavelengths (see, e.g., valley 54).

Spectrum T3 of FIG. 5 is associated with an infrared-transparent pigment and has a low transmission at blue wavelengths (see, e.g., region 58 of the T3 curve) and rapidly increasing transmission at intermediate visible wavelengths (see, e.g., region 60 of the T3 curve), and a high transmission at red and infrared wavelengths (see, e.g., region 62 of the T3 curve).

FIG. 7 is a graph in which light transmission T has been plotted as a function of wavelength for an illustrative ambient light sensor coating 38 with pigments of three different colors (e.g., infrared-transparent pigment, blue pigment, and black pigment of the type described in connection with FIG. 5 or other pigments with different respective light transmission characteristics). Curve 64 corresponds to light transmission for light with an angle of incidence AOI of 0° and curve 66 corresponds to light transmission for light with an angle of incidence AOI of 70°. The difference in light transmission between these curves is small (less than 0.5% at 700 nm and even less at shorter wavelengths) due to the relatively flat spectral shape of curves 64 and 66. To create the relatively flat transmission curve for layer 38, layer 38 incorporates a relatively small amount of carbon black, uses blue pigment to raise light transmission at blue wavelengths relative to other visible wavelengths, and uses infrared-transmitting pigment to reduce light transmission at wavelengths of about 450-550 nm. As shown in FIG. 7, ambient light sensor layer 38 has a spectrum that is characterized by a transmission value at red wavelengths (wavelengths of 600 nm and longer) that is less than 4/3 that of the transmission value at blue wavelengths (wavelengths of 500 nm and less). In contrast, conventional ambient light sensor ink is characterized by a transmission value at red wavelengths that is greater than 1.7 times that of the transmission value at blue wavelengths. By maintaining the transmission spectrum of layer 38 at a flatness of the type shown in FIG. 7 or flatter, ambient light sensor errors due to changes in light transmission at different wavelengths as a function of angle of incidence may be minimized (e.g., color ambient light sensor accuracy can be enhanced).

The carbon black pigment is preferably of a relatively small size to help reduce reflections from layer 38 and to help match the appearance of layer 38 to that of the opaque masking layer (i.e., layer 36 in configurations in which layer 36 is between layer 38 and layer 30). The difference in luminance L (in LAB color space) between layers 38 and 36 is preferably less than 0.4 (e.g., 0.3, 0.1-0.5, less than 1.5, less than 1.0, less than 0.5, or other suitable value). The value of L may be about 1-3 in diffuse reflection or may have other suitable values.

The thickness of layer 38 may be about 4-5 microns, 2-8 microns, more than 1 micron, more than 3 microns, less than 7 microns, less than 15 microns, 0.5-20 microns, or other suitable thickness. The transmission of layer 38 may be about 3-4 percent, may be about 1-10% or may have other suitable transmission values. The reflectivity of layer 38 may be about 1-2%, 0.5-5% or other suitable values. Layer 38 and layer 36 may have dark black appearances or other suitable appearances.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a light sensor;
   a transparent structure having a portion forming a window that is aligned with the light sensor; and
   a coating on the transparent structure, wherein the coating is interposed between the light sensor and the transparent structure, wherein the coating overlaps the window and the light sensor, the coating has a first transmission at red wavelengths and a second transmission at blue wavelengths, the first and second transmissions are transmitted through the window and the coating, the first transmission is greater than the second transmission, the first transmission is less than 4/3 of the second transmission, and the coating transmits less than 30% of light across visible light wavelengths.

2. The electronic device defined in claim 1 wherein the light sensor comprises an ambient light sensor.

3. The electronic device defined in claim 2 further comprising a display, wherein the transparent structure comprises a transparent layer of the display.

4. The electronic device defined in claim 3 wherein the coating includes at least three pigments.

5. The electronic device defined in claim 4 wherein the pigments include black pigment.

6. The electronic device defined in claim 5 wherein the pigments include a pigment selected from the group consisting of: blue pigment and infrared-transparent pigment.

7. The electronic device defined in claim 5 wherein the pigments include blue pigment.

8. The electronic device defined in claim 7 wherein the pigments include infrared-transparent pigment.

9. The electronic device defined in claim 8 wherein the ambient light sensor comprises a color ambient light sensor.

10. The electronic device defined in claim 5 wherein the ambient light sensor comprises a color ambient light sensor.

11. The electronic device defined in claim 5 wherein the coating has a thickness of 3-8 microns and wherein the black pigment comprises carbon black with an aggregate size of less than 20 microns and a particle size of less than 30 nm.

12. An electronic device, comprising:
a display having a display cover layer that overlaps an active area with pixels that display images and an inactive area without pixels;
an ambient light sensor that receives light through a continuous window in a portion of the display cover layer that overlaps the inactive area, wherein the continuous window overlaps the ambient light sensor; and
a coating on the coutinuous window of the display cover layer, wherein the coating includes at least three pigments and wherein the coating and the at least three pigments are in the continuous window and directly overlap the ambient light sensor.

13. The electronic device defined in claim 12 wherein the coating includes black pigment.

14. The electronic device defined in claim 13 wherein the black pigment comprises carbon black.

15. The electronic device defined in claim 14 wherein the carbon black has an aggregate size of less than 15 microns and a particle size of less than 25 nm.

16. The electronic device defined in claim 15 wherein the coating is interposed between the ambient light sensor and the display cover layer and wherein the ambient light sensor comprises a color ambient light sensor.

17. The electronic device defined in claim 16 wherein the coating has a first transmission at red wavelengths and a second transmission at blue wavelengths, wherein the first transmission is less than 4/3 of the second transmission, and wherein the first transmission and the second transmission have transmission values of 1-10%.

18. An electronic device, comprising:
a housing;
a display in the housing that has a transparent layer;
a black opaque masking layer on the transparent layer that has an opening that forms an ambient light sensor window;
a color ambient light sensor in the housing that receives ambient light through the ambient light sensor window; and
a layer on the transparent layer in the opening that has a total light transmission at 500 nm and that has a total light transmission at 600 nm that is less than 4/3 of the total light transmission at 500 nm, wherein the total light transmission at 500 nm and the total light transmission at 600 nm have transmission values between 1% and 10% through the layer in the opening, wherein the layer comprises at least three different pigments, and wherein the three pigments include black pigment and blue pigment.

19. The electronic device defined in claim 18 wherein the at least three different pigments are in the opening in the black opaque masking layer.

20. The electronic device defined in claim 18 wherein the three pigments further include infrared-transparent pigment and wherein the layer includes polymer binder.

21. The electronic device defined in claim 20 wherein the at least three different pigments directly overlap the ambient light sensor window and the color ambient light sensor.

* * * * *